(12) United States Patent
Patterson

(10) Patent No.: US 8,268,669 B2
(45) Date of Patent: *Sep. 18, 2012

(54) LASER OPTICAL PATH DETECTION

(75) Inventor: Joseph Martin Patterson, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/050,822

(22) Filed: Mar. 17, 2011

(65) Prior Publication Data

US 2011/0169478 A1 Jul. 14, 2011

Related U.S. Application Data

(63) Continuation of application No. 12/145,566, filed on Jun. 25, 2008, now Pat. No. 7,392,119.

(51) Int. Cl.
*H01L 21/44* (2006.01)
*H01L 21/48* (2006.01)
*H01L 21/50* (2006.01)

(52) U.S. Cl. ... 438/106; 438/57; 438/463; 257/E21.134; 257/E21.347; 257/E21.498; 257/E21.499; 257/E21.517

(58) Field of Classification Search ............... 438/7, 21, 438/25, 51, 64, 57, 106, 123, 134, 461, 463, 438/611; 257/E21.134, E21.327, E21.347, 257/E21.498, E21.499, E21.517
See application file for complete search history.

(56) References Cited

U.S. PATENT DOCUMENTS

| 7,931,849 B2 * | 4/2011 | Patterson | 264/400 |
| 7,932,119 B2 * | 4/2011 | Patterson | 438/57 |
| 8,106,665 B2 * | 1/2012 | Patterson | 324/501 |
| 2009/0323287 A1 * | 12/2009 | Patterson | 361/709 |

OTHER PUBLICATIONS

Eric Paranal, "Localized Die Metallization Damage Induced During Laser-Marking of a Semiconductor Package", Proceedings of the 33rd International Symposium for testing and Fai.

\* cited by examiner

*Primary Examiner* — David Nhu
(74) *Attorney, Agent, or Firm* — Law Office of Gerald Maliszewski; Gerald Maliszewski

(57) ABSTRACT

A method is provided for detecting laser optical paths in integrated circuit (IC) packages. The method provides an IC die encapsulated as a package in a compound of glass spheres and epoxy. Power is supplied to the IC. The IC is scanned with a laser. Typically, a laser wavelength is used that is minimally absorbed by the glass spheres in the epoxy compound of the IC package, and changes in current to the IC are detected. A detected current change is cross-referenced against a scanned IC package surface region. This process identifies an optical pathway underlying the scanned IC package surface region. In some aspects, this process leads to the identification of a glass sphere-collecting package structure underlying the optical pathway. Examples of a glass sphere-collecting structure might include an inner lead wire, lead frame edge, or die edge.

9 Claims, 7 Drawing Sheets

FIG. 1 *(PRIOR ART)*

LASER OPTICAL PATH DETECTION

RELATED APPLICATIONS

This application is a Continuation a patent application entitled, LASER OPTICAL PATH DETECTION IN INTEGRATED CIRCUIT PACKAGING, invented by Joseph Patterson, Ser. No. 12/145,566, filed Jun. 25, 2008, now U.S. Pat. No. 7,932,119, which is incorporated herein by reference.

BACKGROUND OF THE INVENTION

1. Field of the Invention

This invention generally relates to integrated circuit (IC) fabrication and, more particularly, to a method for non-destructively detecting a laser optical path through an IC package.

2. Description of the Related Art

IC devices are formed from a die of active semiconductor devices. The die can be mounted in a hybrid circuit, printed circuit board (PCB), or a package. For environmental protection, the die may be covered by a passivation layer. However, a package is more typically used since it also dissipates heat and provides a lead system for electrical connections. There are many different types of packages including through-hole, surface mount device (SMD) dual/quad, and SMD area array packages.

FIG. 1 is a perspective view of a dual in-line package (DIP) (prior art). It is common for a package body or lead frame 100 to have a die attach area 102. The die 106 has electrical contact pads on its top surface. Inner leads 108 connect pads on die top surface to outer leads or lead frames 110. Once the inner leads are bonded to the lead frames, the package is sealed with ceramic, in a metal can, or in a polyimide. Epoxy resins are also a common choice. Glass beads are commonly mixed in with the epoxy to reduce strain in the epoxy film during changes in temperature.

Optical beam induced current (OBIC) is a semiconductor analysis technique performed using laser signal injection. The technique induces current flow in the semiconductor sample through the use of a laser light source. This technique is used in semiconductor failure analysis to locate buried diffusion regions, damaged junctions, and gate oxide shorts.

The OBIC technique may be used to detect the point at which a focused ion beam (FIB) milling operation in bulk silicon of an IC must be terminated. This is accomplished by using a laser to induce a photocurrent in the silicon, while simultaneously monitoring the magnitude of the photocurrent by connecting an ammeter to the device's power and ground. As the bulk silicon is thinned, the photocurrent increases as the depletion region of the well to substrate junction is reached. FIB milling operations are terminated in a region below the well depth, so the device remains operational.

FIG. 2 is a partial cross-sectional view of an optical pathway formed through glass beads in an epoxy compound sealant. The laser marking, or labeling by material ablation, of integrated circuits is routinely performed using a $CO_2$ laser, directly on the package surface after the epoxy mold compound is applied. It has been reported in technical literature that an integrated circuit can be damaged using a laser for identification marking on the outside of the package. An optical path can be inadvertently formed by the alignment of the glass particles in the epoxy mold compound. During the marking process, a laser can follow the optical path to the die. If the laser energy is sufficient, metal lines on the die can be melted and shorted, or active semiconductor regions of the die can be damaged. As IC packages continue to decrease in size, the epoxy compound thicknesses inherently decrease, and the statistical probability of forming inadvertent optical paths through the glass particles increases.

It should be noted that the use of epoxy compounds with glass beads is an industry standard. The size and distribution of glass balls determines the flow characteristics, uniformity, and void formation. The glass balls "balance" other ingredients in the epoxy that have been developed and improved for years. The removal of glass balls from epoxy compounds would be a major complication for packaging assemblers and epoxy suppliers. Further, the use of materials other than glass balls would require the requalification of many IC packages.

The optical pathways caused by glass balls can potentially be identified through metallurgical cross-sectioning in multiple locations, and detailed examination of the cross-sections. However, this cross-sectioning process is tedious and labor intensive. Nondestructive investigation methods such as x-ray and acoustic microscopy cannot detect these optical pathways.

It would be advantageous if a method existed to detect the susceptibility of an IC within a package to laser identification marking damage, in an effort to improve the quality and reliability of packaged integrated circuits.

SUMMARY OF THE INVENTION

The present invention describes a method for examining integrated circuit packages and detecting optical paths through the package to the die surface. A laser scanning microscope is configured in the Optical Beam Induced Current (OBIC) mode, or Thermally Induced Voltage Alteration (TIVA) mode. The laser is then scanned over the area of the outside of the package above the die surface location. Connections to the appropriate power supply pins are made to the input of the OBIC (or TIVA) amplifier, and laser-induced current is monitored.

Accordingly, a method is provided for detecting laser optical paths in integrated circuit (IC) packages. The method provides an IC die encapsulated as a package in a compound of glass spheres and epoxy. Power is supplied to the IC. The IC is scanned with a laser. Typically, a laser wavelength is used that is minimally absorbed by the glass spheres in the epoxy compound of an IC package, and changes in current to the IC are detected. A detected current change is cross-referenced against a scanned IC package surface region. This process identifies an optical pathway underlying the scanned IC package surface region. In some aspects, this process leads to the identification of a glass sphere-collecting package structure underlying the optical pathway. Examples of a glass sphere-collecting structure might include an inner lead wire, a lead frame edge, or a Si die edge.

Additional details of the above-described method are provided below.

DETAILED DESCRIPTION

A new cause for the failure of integrated circuits was reported in a paper by Intel at the 2007 ISTFA conference, wherein damage to the encapsulated integrated circuit was induced during laser package marking due to local heating. As noted above, it is possible to form optical paths in an epoxy mold compound to the die surface, through the spheres of glass filler. The problem is becoming more critical as IC packages, and their epoxy compound thicknesses decrease in size.

To examine packages that may be susceptible to this failure mechanism, Optical Beam Induced Current (OBIC) and Thermally Induced Voltage Alteration (TIVA) laser imaging techniques can be used to electrically detect optical transmission through thin packages. The enclosed integrated circuit acts as a detector while the laser is scanned on the outside of the package. In one aspect, the TIVA laser causes some heating of the IC and the resultant resistance change is detected electronically through the leads of the device. The OBIC laser causes the generation of electron-hole pairs in the crystal silicon die that results in a current that is then detected as a voltage at the pins of the device. In some aspects, both lasers are used simultaneously.

Figure 3:
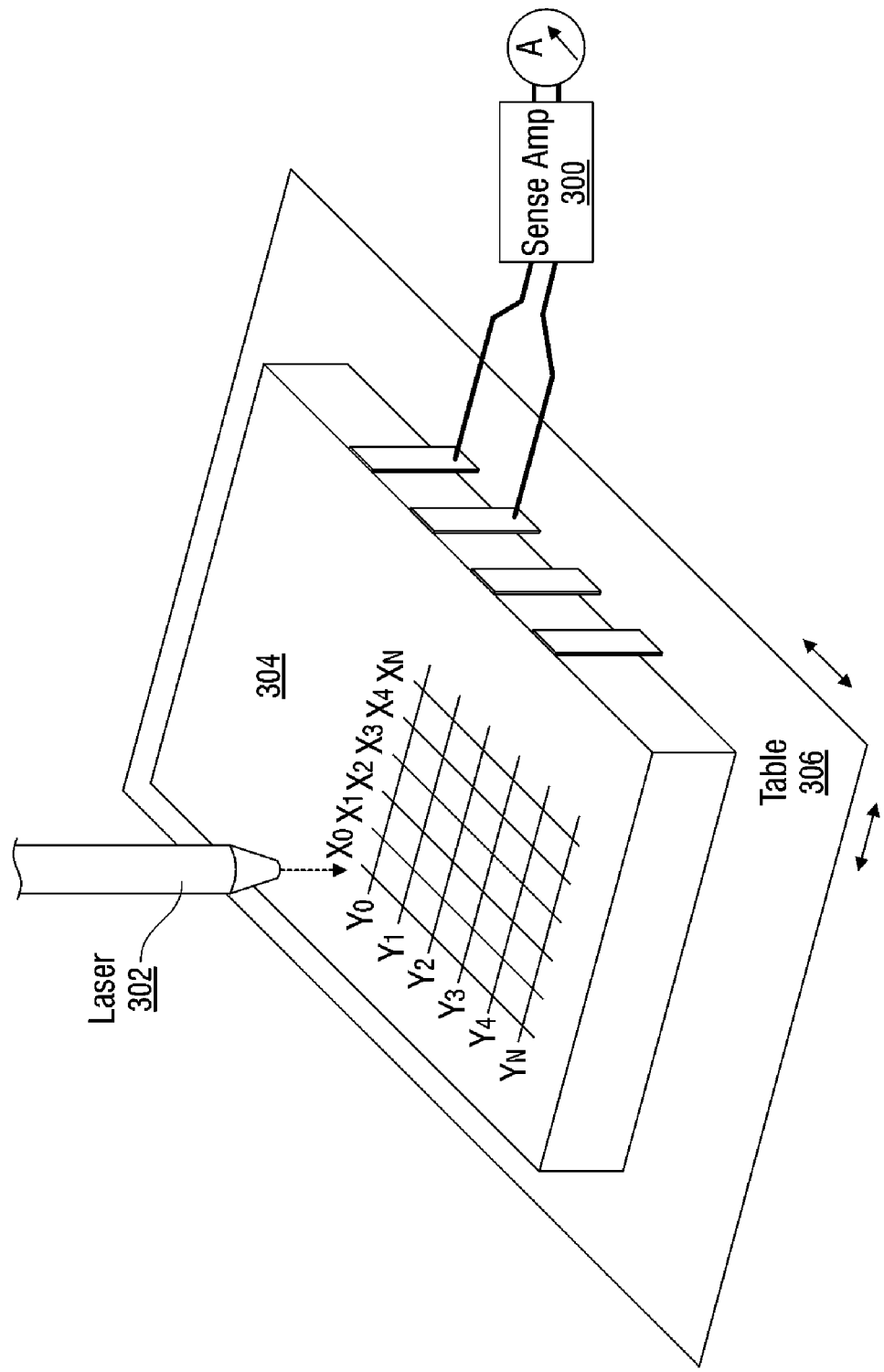
FIG. 3 depicts an exemplary system for detecting optical paths through an IC package.

FIG. 3 depicts an exemplary system for detecting optical paths through an IC package. Selected power pins from the IC are connected to a sense amp 300, as are the IC grounds. A laser 302 scans an area of an IC package 304 overlying the die (not shown). The scanning area is defined by an x-y coordinate system. The IC package 304 is mounted on a movable table 306. Alternately, the IC package position is fixed and the laser moves. The scan pattern need not necessarily follow the x-y grid. In some aspects, only selected areas of the package surface over the die are scanned.

Figure 4:
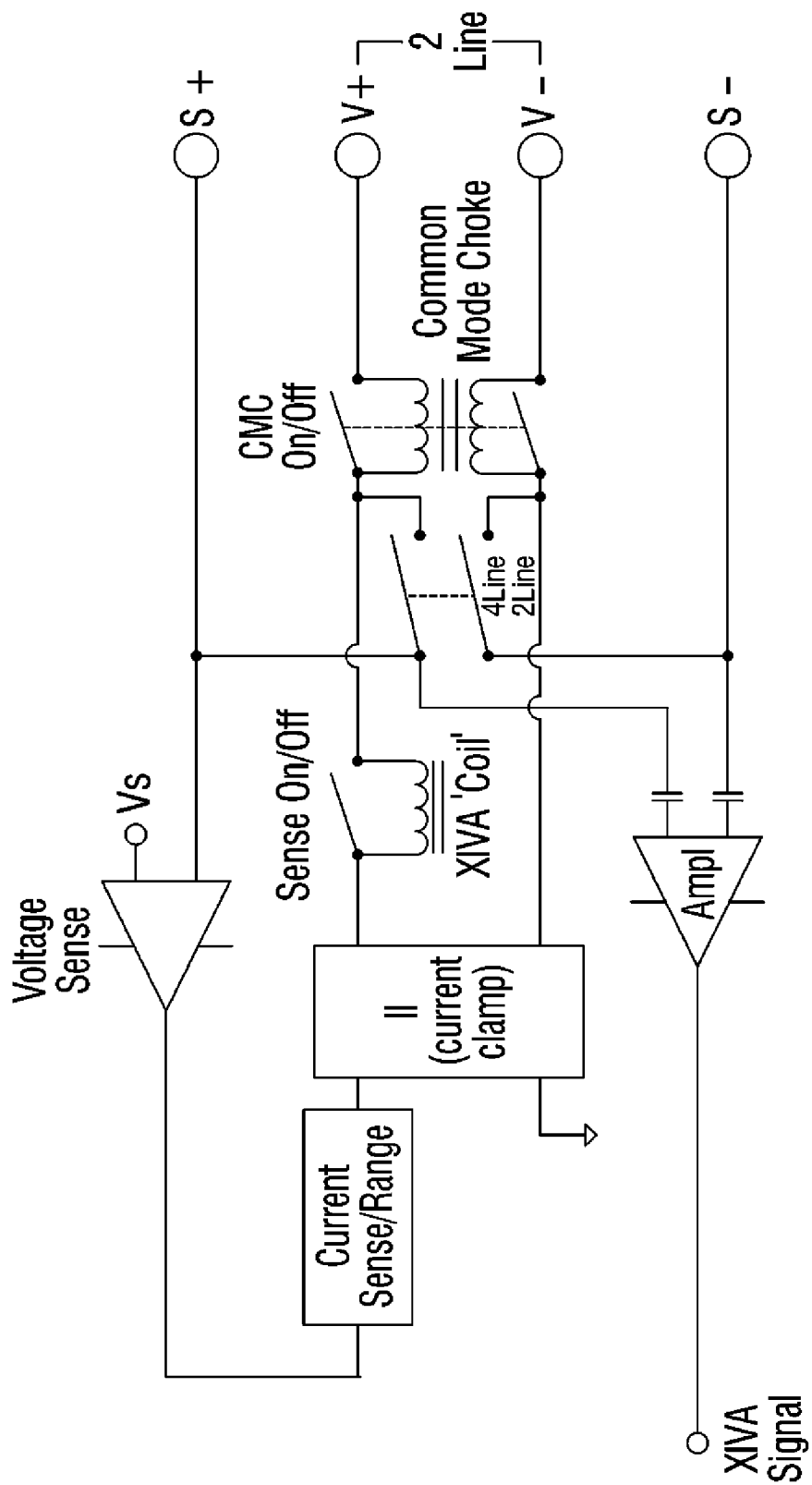
FIG. 4 is a detailed schematic of a sense amplifier.

FIG. 4 is a detailed schematic of a sense amplifier. The sense amplifier 400 connects lines V+ and S+ to IC power supply lines, while inputs V− and S− are typically connected to ground. In other aspects, the sense amplifier lines may be connected to signal inputs or signal outputs.

Imaging is performed through the top of the package with the epoxy compound intact. Electrical connections are made to the power supply pins of the device and those connections go to a current amplifier for video imaging the package surface as the OBIC laser is scanned. The OBIC laser has a 1065 nanometers wavelength and does not ablate the epoxy mold compound. However, glass spheres in the epoxy will pass that wavelength. Also, this wavelength will generate electron hole pairs in the semiconductor die and create a current if the laser light reaches the die surface (and the junctions are not covered by metal).

A package marking laser is more powerful than the OBIC laser. Typically, a marking laser is a $CO_2$ laser tunable in the wavelength of 8 to 12 microns, with a power in the range of 10-20 watts. The marking necessarily ablates the mold compound to mark the package, and if it passes through the epoxy, it can cause damage to the die. In contrast, the optical path (OBIC or TIVA) testing lasers typically use a power of less than 100 milliwatts.

Figure 5:
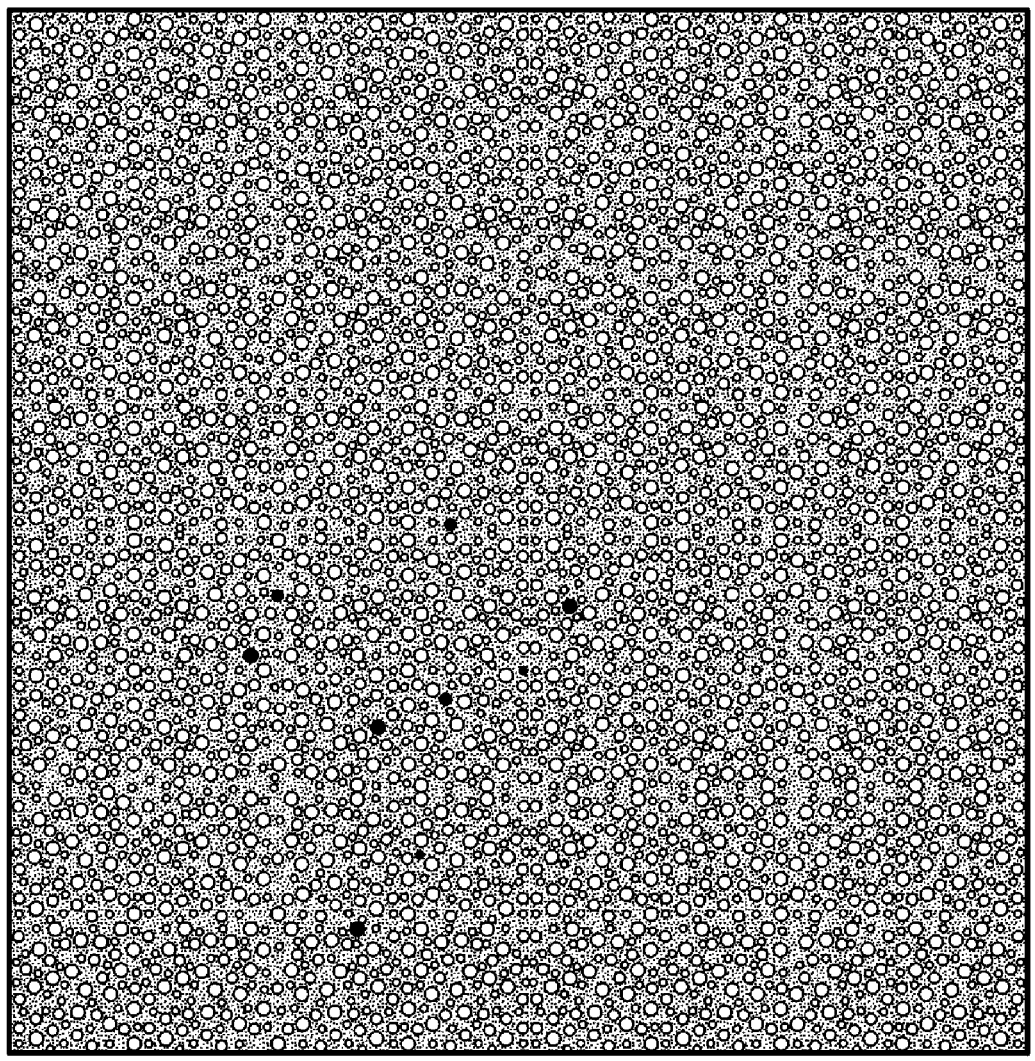
FIG. 5 is a diagram depicting an OBIC video image through the top of the package over the die area.

FIG. 5 is a diagram depicting an OBIC video image through the top of the package over the die area. The "clear" circular spots are the glass spheres in the epoxy mold compound reflecting the laser. The "solid" circular spots are locations where the OBIC laser has reached the die surface through a path of glass spheres, and caused a current in the semiconductor junctions. About nine sites are detected indicating a path to the IC.

Figure 6:
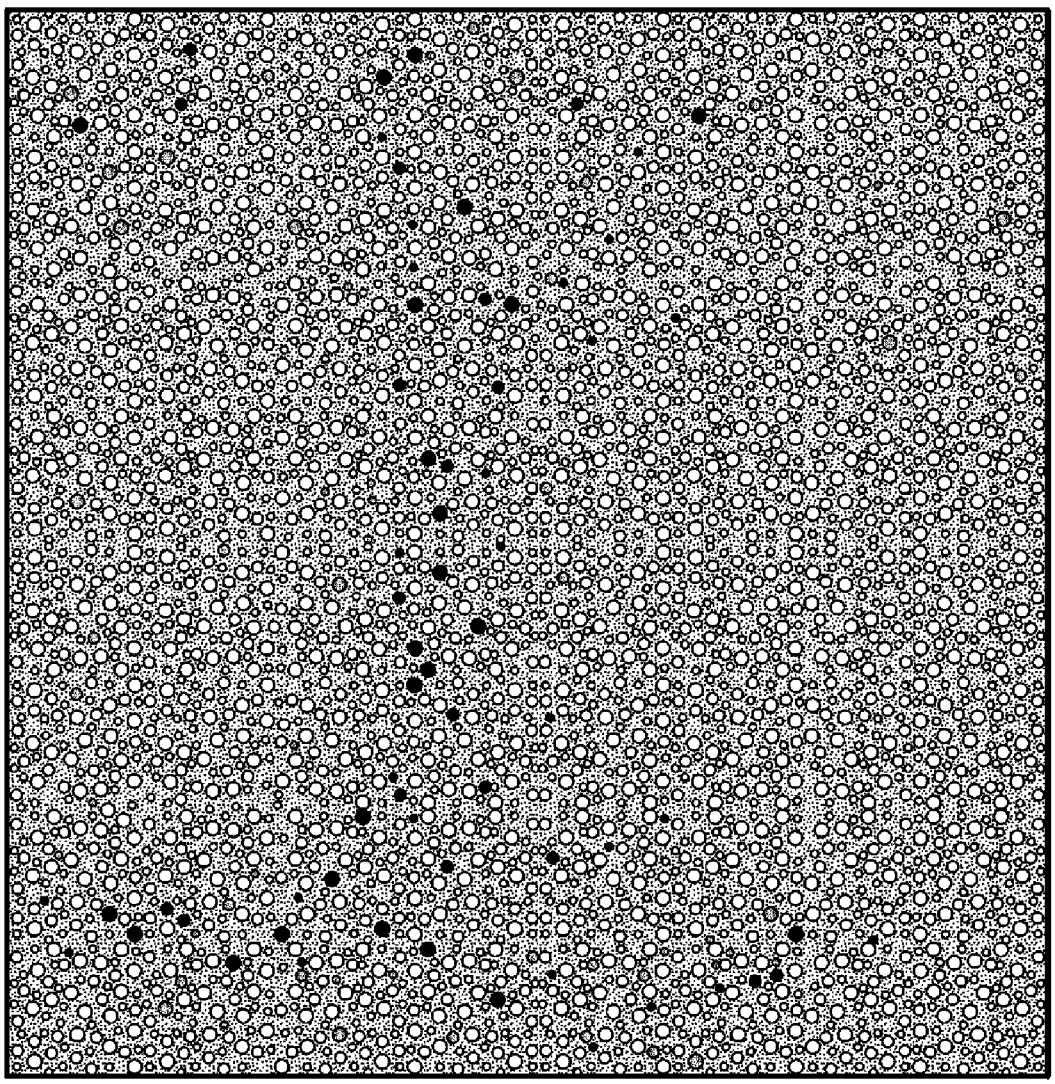
FIG. 6 is a diagram depicting a TIVA video image using a 1340 nanometer laser.

FIG. 6 is a diagram depicting a TIVA video image using a 1340 nanometer laser. The TIVA image is of the same device type viewed in FIG. 5. The top of the package was polished to a depth that just removed the laser marking. The "solid" circular spots are locations where the laser went through glass filler particle optical path to the die surface, and was detected electrically by the circuit. The "clear" circular spots are the glass filler particles on the surface showing up in the reflected image.

Figure 1:
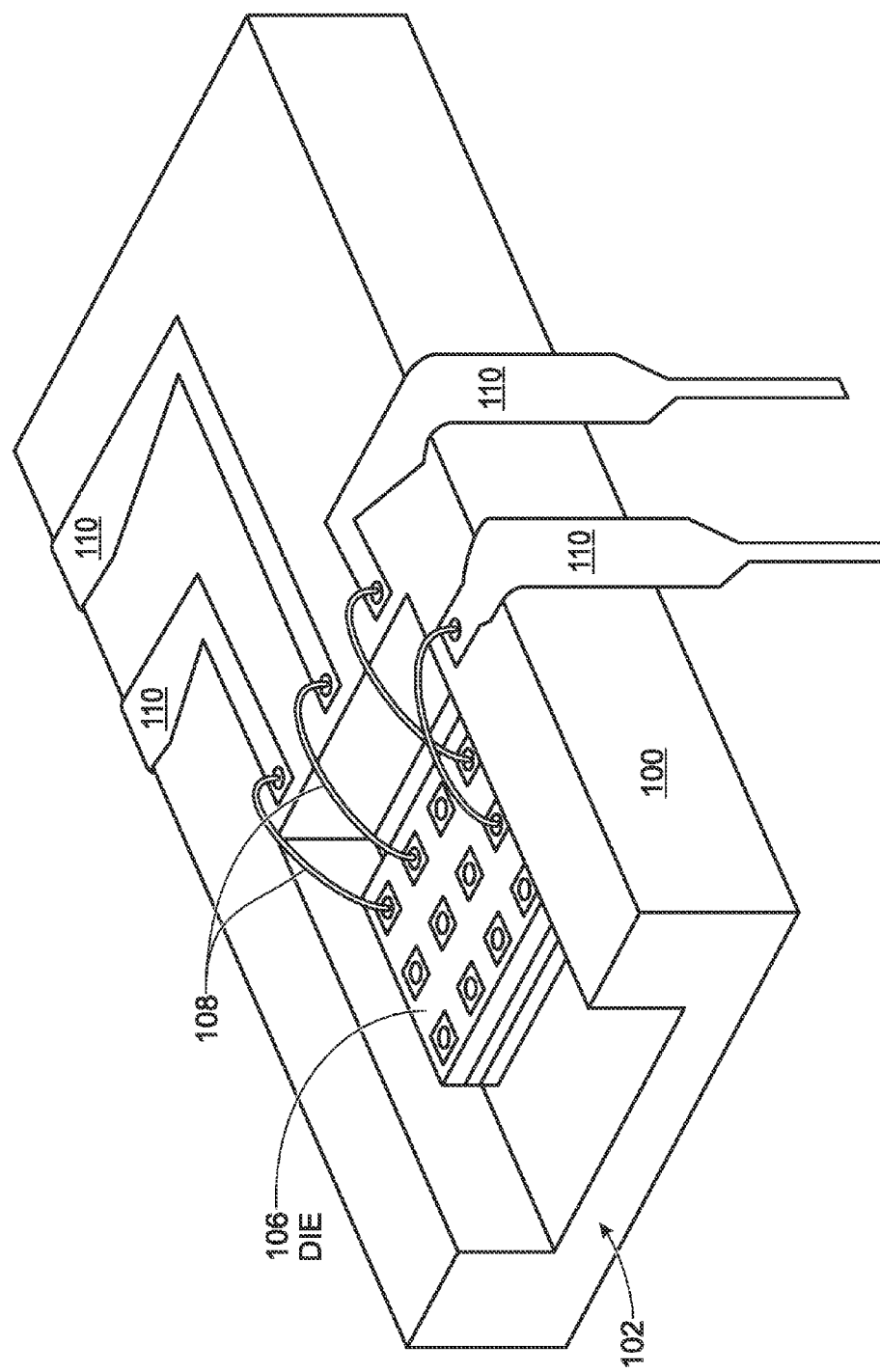
FIG. 1 is a perspective view of a dual in-line package (DIP) (prior art).
Figure 2:
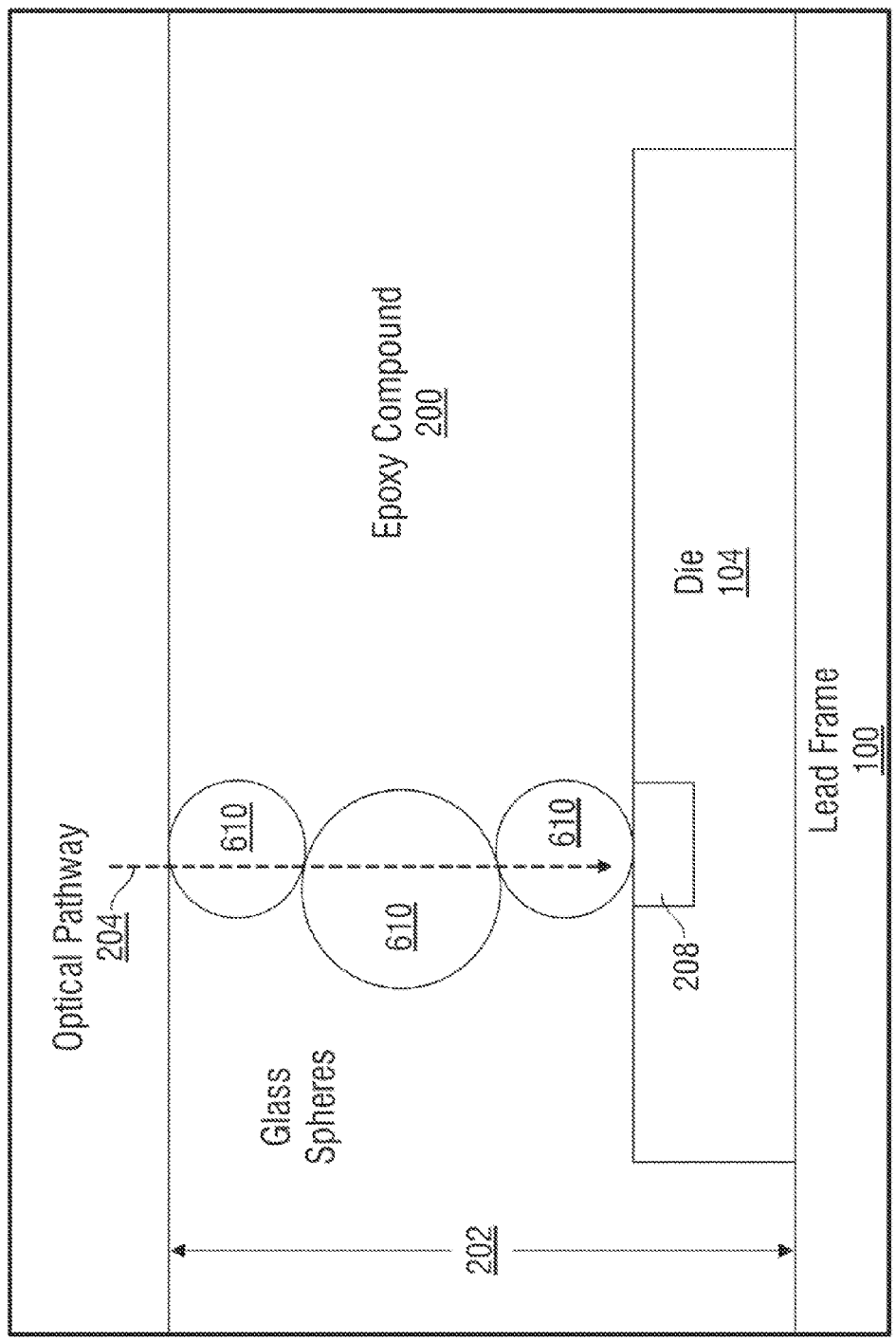
FIG. 2 is a partial cross-sectional view of an optical pathway formed through glass beads in an epoxy compound sealant.

Returning to FIG. 2, die 104 is mounted on lead frame 100. An epoxy compound 200 overlies the die and lead frame. The epoxy compound 200 has a thickness 202. As shown, an optical path 204 is formed through the alignment of three glass spheres 206, exposing a sensitive region 208 of die 104.

Figure 7:
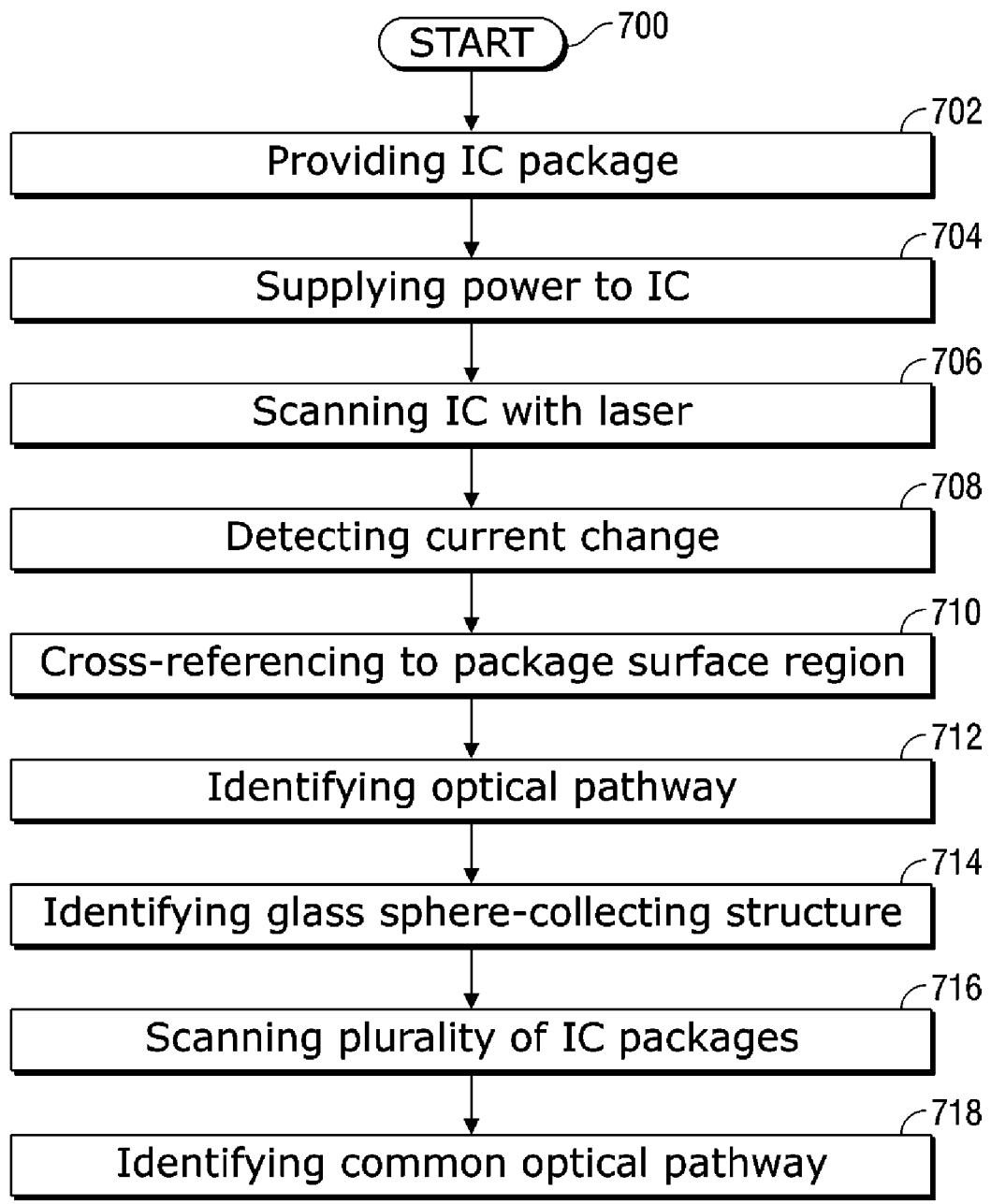
FIG. 7 is a flowchart illustrating a method for detecting laser optical paths in IC packages.

FIG. 7 is a flowchart illustrating a method for detecting laser optical paths in IC packages. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 700.

Step 702 provides an IC die encapsulated as a package in a compound of glass spheres and epoxy. Step 704 supplies power to the IC. Step 706 scans the IC with a laser. Step 708 detects changes in current to the IC. Step 710 cross-references a detected current change against a scanned IC package surface region. Step 712 identifies an optical pathway underlying the scanned IC package surface region. For example, Step 712 may identify a column of vertically aligned, or almost vertically aligned glass spheres.

In one aspect, Step 714 identifies a glass sphere-collecting package structure underlying the optical pathway. That is, a detected optical pathway may be co-located with a structure that is prone to "collecting" glass spheres. Some examples of a structure that might collect glass particles are die bonding wires or the die itself. That is, the die may have non-planar surface features. In addition, the lead frame in the vicinity of the die may act to capture glass spheres.

Moreover, Step 716 scans a plurality of IC packages, and Step 718 identifies an optical pathway overlying a package structure common to the plurality of IC packages. If a sufficient number of common optical pathways are identified, or if an optical pathway is identified as likely to occur in a significant number of IC packages, a manufacture may choose to change the die design, the die bonding, the shape of the lead frame, the epoxy thickness, or the sealant material.

In one aspect, supplying power to the IC in Step 704 includes connecting current sense amplifiers between IC power pins and IC ground pins. Optionally, when current sense amplifiers are connected, the IC power pins may be dc biased.

Scanning the IC with a laser in Step 706 may include scanning with a laser having a wavelength that is minimally absorbed by glass spheres in the epoxy compound of the IC package. An Optical Beam Induced Current (OBIC) laser has a wavelength of about 1065 nanometers (nm), and a Thermally Induced Voltage Alteration (TIVA) laser has a wavelength of about 1340 nm may be used.

In one aspect, providing the IC die encapsulated with the compound of glass spheres and epoxy in Step 702 includes encapsulating with an epoxy/glass sphere layer having a thickness of less than 300 microns. Although it is statistically possible to inadvertently form an optical pathway through any thickness of epoxy, the occurrence of optical pathways becomes significantly more likely once the epoxy compound thickness is less than 300 microns. Further, while the glass spheres do not necessarily have a uniform diameters, optical pathways are more likely to be formed with glass spheres having a diameter of greater than 30 microns.

A method has been provided for detecting laser optical paths in an IC package. Examples of particular laser wavelengths and scanning techniques have been given to illustrate the invention. However, the invention is not limited to merely these examples. Other variations and embodiments of the invention will occur to those skilled in the art.

I claim:

1. A method for detecting the susceptibility of integrated circuit (IC) package/dies to laser identification marking, the method comprising:
   providing a plurality of IC dice, each die encapsulated as a package in a compound of glass spheres and epoxy;
   supplying power to each IC package/die;
   scanning each IC package/die with a laser having a power of less than 100 milliwatts;
   detecting changes in current to each IC package/die occurring as a result of the laser encountering an optical pathway in the IC package;
   for each IC package/die, cross-referencing detected current changes against scanned IC package/die surface regions; and,
   identifying an IC die package structure, common to the plurality of IC package/dice, susceptible to an overlying optical pathway.

2. The method of claim 1 wherein supplying power to each IC package/die includes connecting current sense amplifiers between IC power pins and IC ground pins.

3. The method of claim 2 wherein connecting current sense amplifiers includes dc biasing the IC power pins.

4. The method of claim 1 wherein scanning each IC package/die with the laser includes scanning with a laser having a wavelength that is minimally absorbed by the glass spheres in the epoxy compound of the IC package/die.

5. The method of claim 4 wherein scanning each package/die with the laser includes scanning with a laser selected from a group consisting of an Optical Beam Induced Current (OBIC) laser having a wavelength of about 1065 nanometers (nm), a Thermally Induced Voltage Alteration (TIVA) laser having a wavelength of about 1340 nm, and a combination of the above-mentioned lasers.

6. The method of claim 1 wherein providing the plurality of IC dice encapsulated with the compound of glass spheres and epoxy includes encapsulating with an epoxy/glass sphere layer having a thickness of less than 300 microns.

7. The method of claim 1 wherein providing the plurality of IC dice encapsulated with the compound of glass spheres and epoxy includes encapsulating with an epoxy/glass sphere layer having glass spheres with a diameter of greater than 30 microns.

8. The method of claim 1 wherein identifying the IC die package structure underlying the optical pathway includes identifying a package structure selected from a group consisting of a die bonding wire, the die, and the lead frame.

9. The method of claim 1 wherein identifying the optical pathway includes identifying a column of vertically aligned glass spheres.

* * * * *